US009796581B2

United States Patent
Landais et al.

(10) Patent No.: US 9,796,581 B2
(45) Date of Patent: Oct. 24, 2017

(54) PROCESS FOR FABRICATING HIGH-PRECISION OBJECTS BY HIGH-RESOLUTION LITHOGRAPHY AND DRY DEPOSITION AND OBJECTS THUS OBTAINED

(75) Inventors: Stéphane Landais, Chaville (FR); Fayçal Bouamrane, Gif sur Yvette (FR); Thomas Bouvet, Paris (FR); Olivier Dessornes, Villebon s/Yvette (FR); Pierre Josso, Erquy (FR); Stéphan Megtert, Villebon sur Yvette (FR); Roger Valle, Clamart (FR)

(73) Assignee: ONERA (OFFICE NATIONAL D'ETUDES ET DE RECHERCHES AEROSPATIALES), Chatillon (FR)

( * ) Notice: Subject to any disclaimer, the term of this patent is extended or adjusted under 35 U.S.C. 154(b) by 1109 days.

(21) Appl. No.: 13/977,642

(22) PCT Filed: Dec. 26, 2011

(86) PCT No.: PCT/FR2011/000679
§ 371 (c)(1),
(2), (4) Date: Nov. 11, 2013

(87) PCT Pub. No.: WO2012/089934
PCT Pub. Date: Jul. 5, 2012

(65) Prior Publication Data
US 2014/0057104 A1 Feb. 27, 2014

(30) Foreign Application Priority Data
Dec. 29, 2010 (FR) ...................................... 10 05157

(51) Int. Cl.
*C23C 14/00* (2006.01)
*B81C 1/00* (2006.01)
(Continued)

(52) U.S. Cl.
CPC ............ *B81C 1/00198* (2013.01); *B81B 5/00* (2013.01); *B82Y 10/00* (2013.01); *B82Y 40/00* (2013.01);
(Continued)

(58) Field of Classification Search
None
See application file for complete search history.

(56) References Cited

U.S. PATENT DOCUMENTS 4,111,783 A 9/1978 Bindell et al.
5,457,298 A * 10/1995 Nelson .............. H01J 37/32082
156/345.46
(Continued)

FOREIGN PATENT DOCUMENTS

EP 1 835 050 A1 9/2007
EP 2 263 846 A1 12/2010
(Continued)

OTHER PUBLICATIONS

International Search Report, corresponding to PCT/FR2011/000679, dated Apr. 12, 2012, 6 pages.
(Continued)

*Primary Examiner* — Timon Wanga
(74) *Attorney, Agent, or Firm* — Lewis Roca Rothgerber Christie LLP (57) ABSTRACT

The invention relates to a process for fabricating a high-precision object made of at least one inorganic material, comprising the following steps: using a high-resolution photolithography process, employing X-rays or UV rays depending on the desired degree of precision, in a chosen direction Z, to form a negative mold, which does not deform at the microscale during the steps of the process, in a material able to withstand a step for forming the object by dry deposition and capable of either being removed without
(Continued)

altering the object fabricated or being separated from said object; choosing, independently of the normal redox potential of its constituent elements, at least one inorganic material from the set of materials that can be deposited by dry deposition and that allow the object to be fabricated to meet its thermomechanical and environmental specifications; and forming, by means of the non-deformable negative mold, the object to be fabricated by dry deposition of said at least one inorganic material, thereby allowing an object to be fabricated with better than microscale precision, especially with respect to the angle between the walls generated by the dry deposition and said direction Z. The invention is preferably applied to the fabrication of high-precision micromechanical objects, in particular in the aeronautical and clock-/watch-making fields.

19 Claims, 3 Drawing Sheets

(51) Int. Cl.
*B82Y 10/00* (2011.01)
*B82Y 40/00* (2011.01)
*G03F 7/00* (2006.01)
*G03F 7/40* (2006.01)
*B81B 5/00* (2006.01)
*F16C 17/12* (2006.01)
*G03F 7/20* (2006.01)

(52) U.S. Cl.
CPC ............ *F16C 17/12* (2013.01); *G03F 7/0002* (2013.01); *G03F 7/20* (2013.01); *G03F 7/40* (2013.01); *Y10T 428/2976* (2015.01)

(56) References Cited

U.S. PATENT DOCUMENTS

| | | | |
|---|---|---|---|
| 6,506,675 | B1 | 1/2003 | Oomiya et al. |
| 6,518,168 | B1 | 2/2003 | Clem et al. |
| 6,810,104 | B2 | 10/2004 | Morales |
| 2004/0144653 | A1 | 7/2004 | Jerominek et al. |
| 2007/0209437 | A1* | 9/2007 | Xue ..................... B81B 3/0032 73/514.31 |
| 2007/0259293 | A1 | 11/2007 | Shin et al. |
| 2008/0093424 | A1 | 4/2008 | Kumar et al. |
| 2009/0081476 | A1 | 3/2009 | Saucy |

FOREIGN PATENT DOCUMENTS

| | | |
|---|---|---|
| GB | 2 429 841 A | 3/2007 |
| WO | WO 2009/158631 A1 | 12/2009 |

OTHER PUBLICATIONS

Ballandras, et al., "Microgrippers fabricated by the LIGA technique", Sensors and Actuators A: Physical, vol. 58, Issue 3, Mar. 30, 1997, pp. 265-272.

Vassel, "Continuous fibre reinforced titanium and aluminium composites: a comparison", Materials Science and Engineering, vol. A263, 1999, pp. 305-313.

Brunet, et al., "Intermetallic TiAl-Based Matrix Composites: Investigation of the Chemical and Mechanical Compatibility of a Protective Coating Adapted to an Alumina Fibre", Acta Materialia, vol. 48, 2000, pp. 4763-4774.

Kupka, et al., "Microfabrication: LIGA-X and applications", Applied Surface Science, vol. 164 issues 1-4, Sep. 1, 2000, pp. 97-110.

* cited by examiner

PROCESS FOR FABRICATING HIGH-PRECISION OBJECTS BY HIGH-RESOLUTION LITHOGRAPHY AND DRY DEPOSITION AND OBJECTS THUS OBTAINED

CROSS-REFERENCE TO RELATED APPLICATION(S)

This application is a National Phase Patent Application and claims priority to and benefit of International Patent Application Number PCT/FR2011/000679, filed on Dec. 26, 2011, which claims priority of French Patent Application Number 10/05157, filed on Dec. 29, 2010, the entire contents of which are incorporated herein by reference.

The invention relates to a process for fabricating high-precision objects by high-resolution lithography, and to objects obtained by carrying out the process.

It relates in particular to the fabrication of high-precision objects made of materials that cannot be deposited by electroplating, and especially to the fabrication of objects of small size, that is to say of millimetric size. They can be, for example, micromechanical objects or components or electromechanical systems (or MEMS, abbreviation for micro-electro-mechanical systems) used in the aeronautical field, the clock-/watch-making field, etc.

It is known to the person skilled in the art that it is not possible to achieve such a result solely by means of the so-called "LIGA" technique, "LIGA" being an acronym for the German expression "Lithographie, Galvanoformung, Abformung", which means "Lithography, Electroplating, Molding".

That technique consists in coating a substrate, which may or may not be electrically conductive, with a polymerized resin (positive resin) or with a photopolymerizable resin (negative resin). The resin is illuminated through a mask, which has opaque (or transparent) regions, with suitable electromagnetic radiation of short wavelength, that is to say ranging from ultraviolet (LIGA-UV) to X-rays (LIGA-X). By means of this technique, a "stencil" is thus produced, which defines the structures that are to be imprinted in the thickness of the resin. The consequence of the polymer/electromagnetic wave interaction is either to destroy the polymerization of said polymer (positive resin) or to bring about the polymerization and/or crosslinking of the resin (negative resin).

When the chains of the polymer have been cut (positive resin) or, on the other hand, no polymerization/crosslinking reaction has been brought about (negative resin), the polymer can easily be removed.

The apertures or openings so created in the resin can be utilized either to grow a deposit therein by electrolysis of a solution (LIGA process in the strict sense) or to dissolve all or part of the substrate on which the resin was deposited (case of the dissolution of copper by iron perchloride in order to fabricate printed circuits, for example). These techniques have been taught widely in the literature.

A typical LIGA process, known from the prior art, comprises the following steps:
  choosing an electrically conductive substrate;
  depositing on the substrate a layer of photosensitive resin having a thickness varying from 10 μm to 2 mm;
  polymerizing said resin, if necessary;
  arranging a mask on top of the surface of the resin;
  irradiating the resin by means of a beamline (X-rays) of a synchrotron (LIGA-X) or by means of an ultraviolet lamp (LIGA-UV);
  developing, that is to say removing, the depolymerized resin (positive resin) or the non-polymerized/cross-linked resin (negative resin);
  electroforming, in the cavity that has been created, a metal or an alloy (iron, nickel, cobalt, copper, zinc, or alloys such as nickel-cobalt, nickel-palladium or co-deposits such as zinc-nickel, cobalt-tin, or composite deposits such as NiCo+CrAlYTa, this list not being limiting);
  removing the photosensitive resin; and
  separating the micromechanical components so fabricated from the electrically conductive substrate.

Such a technique has the advantage that components having very high precision in the plane of the deposit can be produced. By contrast, precision in the direction perpendicular to the plane of the deposit (thickness of the deposit) is linked with the management of the deposition process. In order to obtain better than micrometric precision in the direction perpendicular to the plane of the deposit, it is, of course, possible to create imbricated forms of the same material or of a different material. It is then sufficient to repeat the procedure on the first level created, using a second mask, for example, either keeping the same material or changing it.

The disadvantage of such a process is, however, that it requires electrically conductive materials, except, perhaps, in the case where a material, such as an oxide, is set within the structure (composite deposit or setting of a stone, as is performed by electroformers involved in jewelry making).

Accordingly, whatever technique is used, there is a limit to the materials that will form the final object. That limit is linked either, within the context of electrolytic deposition, to the laws of electrochemistry for depositing the final material (it is not possible to reduce elements whose normal redox potential is lower than the thermodynamic stability range of their solvent, which is generally water), or, within the context of precision chemical machining of the final object, to the laws of chemistry (it is necessary for the material of the object to be soluble in the etching solution).

Finally, this technique does not permit the fabrication of micromechanical objects of fairly large dimensions, such as gas bearings having a length of 4 mm and a small diameter.

The object of the invention is, especially, to overcome the above-mentioned disadvantages, the problem to be solved being that of fabricating a micromechanical object in a material or materials which cannot be deposited by electroplating and are capable of withstanding very high environmental (corrosion, etc.) and thermomechanical stresses, which is therefore of millimetric size or larger, especially as regards its thickness, and can have forms which are not of revolution, while being of micrometric precision, including as regards the slope of the walls produced in the thickness of the object, wherein the target slope error must be less than 1 micrometer per millimeter of thickness.

To that end, the invention proposes a process for fabricating a high-precision object formed of at least one inorganic material, comprising the following steps:
  using a high-resolution photolithography process employing, in a chosen direction Z, radiation of a wavelength adapted to the desired degree of precision, to form a negative mold, which is not deformable on the micrometric scale during the steps of the process, in a material that is resistant to a step of forming the object by dry deposition and that can either be removed without altering the fabricated object or separated from said object;
  choosing, independently of the normal redox potential of its constituent elements, at least one inorganic material from the group of materials that can be deposited by dry deposition and are capable of enabling the object to be fabricated to satisfy its thermomechanical and environmental demands; and carrying out, by means of the non-deformable negative mold, the forming of the object to be fabricated by dry deposition of said at least one inorganic material, permitting the fabrication of an object that comprises at least one part in the form of a straight cylinder (which is not necessarily of revolution) whose generating line is parallel to the chosen direction Z, having a thickness of millimetric order (the thickness of the object not necessarily corresponding to the thickness of the deposit) in the direction Z, the precision of the various parts of the object being better than micrometric, especially as regards the parallelism between said direction Z and the walls of said part generated by dry deposition, the slope error being less than 1 micrometer per millimeter of thickness.

Accordingly, the process of the invention substantially comprises a combination of two techniques which, separately, are known per se, namely a high-resolution photolithography process by means of radiation (for example X- or UV radiation) and dry deposition.

The first technique allows a non-deformable negative mold, that is to say an imprint of the object to be fabricated, to be produced directly or indirectly in a resistant material as defined hereinbefore.

The second technique allows dry deposition of the inorganic material to be carried out in or on the negative mold to constitute the object to be fabricated.

The combination of high-resolution X-ray photolithography, in a chosen direction Z, that is to say in the direction of the photolithography beam, and of dry deposition makes it possible to produce micromechanical components having at least one part in the form of a straight cylinder whose generating line is parallel to said chosen direction Z. The component is obtained with a thickness of millimetric order in the direction Z and micrometric precision, especially parallelism between the direction Z and the walls generated by said dry deposition, the component being produced from one or more materials that cannot be deposited by electroplating.

The above-mentioned material or materials are inorganic materials composed of elements which can be deposited concomitantly and are chosen independently of the normal redox potential of their constituent elements, which broadens the range of usable materials to materials that cannot be deposited by electroplating. It is, in fact, known to the person skilled in the art that the electroforming of objects is limited in the choice of the element or elements to be deposited by its/their redox potential associated with the thermodynamic stability range of the solvent chosen for dissolving the salts.

The LIGA technique is well known and has been the subject of many publications in the literature. Reference may be made especially to the following two publications: "Microgrippers fabricated by the LIGA technique" by S. Ballandras, S. Basrour, L. Robert, S. Megtert, P. Blind, M. Rouillay, P. Bernède, W. Daniau in *Sensors and Actuators A: Physical*, Volume 58, Issue 3, 30 Mar. 1997, pages 265-272 and "Microfabrication: LIGA-X and applications" by R. K. Kupka, F. Bouamrane, C. Cremers, S. Megtert in *Applied Surface Science*, Volume 164 issues 1-4, 1 Sep. 2000, pages 97-110.

The second technique employs dry deposition of the inorganic material or materials that are to constitute the object to be fabricated.

The expression "dry deposition" is here intended to denote any process of dry deposition, provided that the imprint obtained by the high-resolution lithography technique withstands the physico-chemical conditions, especially the atmosphere and the temperature of the dry deposition. It is therefore necessary that the material constituting the negative mold is capable of withstanding the step of forming by dry deposition, and that it can subsequently either be removed without altering the fabricated object or be separated from said object.

The dry deposition is advantageously chosen from the following:
 physical deposition by triode sputtering (TS),
 chemical vapor deposition (CVD) or plasma-enhanced CVD,
 spark plasma sintering (SPS),
 physical vapor deposition (PVD), and
 physical deposition by evaporation, for example electron beam physical vapor deposition (EB-PVD).

Among the various techniques of physical deposition mentioned hereinbefore, very particular preference is given to deposition by triode sputtering (TS).

Further information on deposition by triode sputtering can be found in U.S. Pat. No. 4,111,783.

However, it should be noted that there is often confusion between triode sputtering and diode sputtering, which is better known by its anglo-saxon name: "physical vapor deposition" (abbreviation PVD).

The latter PVD technique, which constitutes physical vapor deposition, is also envisaged within the scope of the invention, as mentioned above.

Within the context of the LIGA techniques, the PVD technique is used substantially with different aims:
 during the lithography step, to produce masks that are opaque to X-rays (LIGA-X), as taught especially by U.S. Pat. No. 6,810,104 B2, and
 to produce a metal bond-coat layer allowing electroforming to be carried out (LIGA-UV), as taught by patent application EP 1 835 050 A1.

The techniques of dry physical vapor deposition are also known. In particular, triode sputtering (TS) allows thin and thick deposits (up to several tens of millimeters) to be obtained, for very varied applications.

There may be mentioned, for example, the studies carried out in the field of titanium matrix composites, which made possible the preparation, by TS deposition of titanium or titanium aluminide (TiAl) on fibers, of materials having excellent structural homogeneity, without altering the fiber. This technique is described, for example, in the publication "Continuous fibre reinforced titanium and aluminium composites: a comparison", A. Vassel in *Materials Science and Engineering*, Volume A263, 1999, pages 305-313 and in "Intermetallic TiAl-based matrix composites: Investigation of the chemical and mechanical compatibility of a protective coating adapted to an alumina fibre", A. Brunet, R. Valle, A. Vassel in *Acta Materialia*, Volume 48, 2000, pages 4763-4774.

As indicated hereinbefore, among the dry physical depositions which can be used in the invention, particular preference is given to deposition by triode sputtering (TS).

The apparatus used for TS depositions can be described as a vacuum chamber (with cryogenic pumping) containing a plasmagenic gas (for example argon) regulated in terms of flow rate and pressure. A tungsten filament heated by the Joule effect emits electrons, which are accelerated by an anode. The electrons interact with the argon atoms to give Ar$^+$ ions. A magnetic field created by two coils arranged above and below the target allows the electron trajectories in the region of the surface of the target to be lengthened and confined in order to increase the chances of ionization of the molecules of neutral gas at that location. This has the result of increasing the bombardment of the metal target, constituted of the material to be deposited, and thus causing the atoms to break away from the material and be deposited on the object to be coated.

The advantage of this technique is that the electric potential of the target has no influence on the continuity of the discharge, which allows low voltages to be used if necessary. The risks of breakdown are thus reduced and, since the bombardment generated is at weaker energies, less cooling of the target is required. This independence of the target relative to the plasma has the effect that the target can have any form, which is not the case with diode processes. The substrate too can be of any form. Because the process is directional, the homogeneity of the deposition depends on its movement and any shadows. Moreover, in the triode system, the discharge can be maintained at a lower pressure than in the direct current diode arrangement (DC diode, conventional PVD) of the order of $10^{-1}$ to $10^{-2}$ Pa, which is an advantage from the point of view of contamination of the layers by the gas used to form the plasma. Finally, the rate of deposition is very high.

It was hitherto not possible to produce objects, in particular micromechanical objects, from materials which cannot be deposited by electroplating and which are capable of withstanding very high thermomechanical and environmental stresses (corrosion, etc.), of micrometric precision, especially as regards the parallelism between the walls generated and the direction Z of photolithography (slope error less than 1 micrometer per millimeter of thickness) and a fortiori of millimetric size or larger and which can have forms that are not of revolution.

More precisely, the invention, which consists substantially in combining two techniques mentioned hereinbefore, namely on the one hand a high-resolution, for example X-ray or UV, photolithography process, and on the other hand a process of dry deposition, such as, for example, triode sputtering, allows such a result to be obtained.

Dry physical deposition, such as, for example, triode sputtering, as a replacement for electroforming, has the advantage of broadening the range of materials available for obtaining a deposit: pure metals, multi-component alloys and superalloys by neutral plasma or, by reactive plasma, oxides, nitrides, carbides, etc., and, finally, mixtures of all those materials with multi-target systems.

Other deposition processes can be envisaged, provided that the imprint obtained by the high-resolution lithography technique withstands the physico-chemical deposition conditions.

As already stated, the process of the invention can be carried out according to two main variants, corresponding respectively to a process called a "direct" process and a process called an "indirect" process.

In the direct process, the negative mold is formed directly in the resistant material. The latter can be, for example, a photosensitive resin.

In the indirect process, the negative mold is formed indirectly in the resistant material, the process step of high-resolution lithography then comprising the following sub-steps:

forming a positive mold of the object to be fabricated in a first material,
    producing in or on the positive mold a deposit of a second resistant material which is to constitute the negative mold.

Advantageously, in a second embodiment of the process of the invention, it comprises a prior step in which there is chosen a substrate which will subsequently be used in the high-resolution lithography process to produce the negative mold.

The negative mold may, where applicable, be deposited on the substrate (photolithography). Moreover, the substrate may, where applicable, be removed partially or completely, be separated or be kept as an integral part of the final object that is to be fabricated. The nature of the substrate will therefore be chosen each time according to the particular case in question (for example, a nickel substrate with a superalloy coating can be dissolved by selective chemical etching, without altering the coating).

Advantageously, in a third embodiment of the process of the invention, according to the second embodiment, the negative mold is formed directly in the resistant material.

Advantageously, in a fourth embodiment of the process of the invention, according to the second embodiment, the resistant material is a photosensitive resin deposited on said substrate.

Advantageously, in a fifth embodiment of the process of the invention, according to the second embodiment, the resistant material is a metal deposited on said substrate.

Advantageously, in a sixth embodiment of the process of the invention, according to one of the preceding embodiments, the high-resolution photolithography process is a photolithography process that employs X-radiation.

The high-resolution photolithography process is advantageously a photolithography process that employs X-radiation for deposits of millimetric thickness, which deposits are single or part of the production of multilayer objects.

Advantageously, in a seventh embodiment of the process of the invention, according to one of the preceding embodiments, the high-resolution photolithography process is a photolithography process that employs UV radiation.

In the case of deposits of micrometric thickness, which are single or part of the production of multilayer objects of millimetric thickness, it is possible to employ X-radiation but also UV radiation.

In the case where greater precision is desired or where the thickness of the object in direction Z is greater than several millimeters, radiation of shorter wavelength, such as, for example, gamma rays, can be used.

Advantageously, in an eighth embodiment of the process of the invention, according to one of the preceding embodiments, the process of the invention comprises the following subsequent steps:

removing the negative mold or separating it from the object to be fabricated; and
    collecting the object so fabricated.

Advantageously, in a ninth embodiment of the process of the invention, according to one of the preceding embodiments, the process step of high-resolution photolithography comprises the following sub-steps:

forming a positive mold of the object to be fabricated in a first material,
    producing in or on the positive mold an electrolytic deposition of a second metallic material, which is the resistant material that is to constitute the negative mold,
    removing the first material in order to recover the negative mold constituted by the second material, and wherein the step of dry deposition is carried out in or on the negative mold of the second material.

Advantageously, in a tenth embodiment of the process of the invention, according to the preceding embodiment, the first material is a photosensitive resin.

Advantageously, in an eleventh embodiment of the process of the invention, according to one of the two preceding embodiments, the second material forming the negative mold is an electrolytic deposit.

The second material forming the negative mold is preferably nickel, and in that case the deposition of the second material can be electrolytic.

Advantageously, in a twelfth embodiment of the process of the invention, according to the ninth or eleventh embodiment, the second material forming the negative mold is removed by chemical etching. This allows the final object to be collected.

Advantageously, in a thirteenth embodiment of the process of the invention, according to one of the preceding embodiments, the dry deposition is chosen from:
  deposition by triode sputtering (TS),
  chemical vapor deposition (CVD) or plasma-enhanced CVD,
  deposition by spark plasma sintering (SPS),
  physical vapor deposition (PVD),
  physical deposition by evaporation, for example electron beam physical vapor deposition (EB-PVD).

Advantageously, in a fourteenth embodiment of the process of the invention, according to the preceding embodiment, the dry deposition is deposition by triode sputtering (TS).

However, it is also possible to use other types of deposition, such as chemical vapor deposition (CVD) or plasma-enhanced CVD.

It is also possible to use deposition by plasma spark sintering (SPS), or physical vapor deposition (PVD).

Finally, it is also possible to use evaporation processes such as the EB-PVD process (electron beam physical vapor deposition).

The main advantages of triode sputtering over PVD (two electrodes on either side of a plasma) are:
  that the discharge can be obtained at a lower pressure, of the order of $10^{-1}$ to $10^{-2}$ Pa, which is an advantage from the point of view of contamination of the deposited layers by the gas used to form the plasma;
  that the third electrode (located at the level of the substrate) allows the rate at which the dry deposition is obtained to be accelerated: 10 to 15 µm per hour, which is similar to the electroforming rate obtained in electroplating (between 10 and 100 µm per hour).

Advantageously, in a fifteenth embodiment of the process of the invention, according to one of the preceding embodiments, the step of high-resolution lithography and the step of dry deposition are repeated at least once with a different inorganic material in order to produce an object formed of at least two different inorganic materials.

Advantageously, in a sixteenth embodiment of the process of the invention, according to one of the preceding embodiments, the inorganic material is chosen from: pure metals, multi-component alloys, superalloys, or any ceramic obtained by that process, and mixtures thereof.

Accordingly, the invention is based on a unique combination of two techniques, the combination of which had never been envisaged jointly hitherto.

The aim of high-resolution photolithography, for example with X-rays or UV rays, is to produce a positive or negative mold of micrometric precision (which therefore a priori is not deformable) of the object to be fabricated. It is, in fact, the precision of the X-ray or UV photolithography of the mask that determines the precision of the fabricated object in the plane of the photolithographic mask. As regards the parallelism between the generating line of direction Z and the generated walls, X-ray photolithography allows a precision better than one micrometer per millimeter of thickness in direction Z to be obtained, while UV photolithography allows such precision to be obtained only with a thickness that is a thousand times smaller, that is to say a thickness of one or several micrometers.

Dry deposition allows a very large variety of materials to be used, namely any inorganic material and especially alloys, the number of constituents of which is virtually unlimited.

The following main results and advantages are thus obtained.

Firstly, high machining precision, because it is the precision of the method of photolithography.

Secondly, it is possible to produce micromechanical objects of large size, optionally by assembling objects that are small and/or of small thickness (that is to say from several atomic layers to about 1 mm).

Finally, the process of the invention eliminates the technological barrier constituted by the limited choice of materials, caused by electrolytic depositions, and especially the impossibility of depositing complex alloys.

By virtue of the invention, the materials which can be used are all inorganic materials (metal alloys, ceramics, etc.), including materials having exceptional properties, such as refractory alloys, shape-memory alloys, heterogeneous materials, ceramics (oxides, nitrides, carbides, etc.).

An additional advantage of the invention is that it allows objects composed of a plurality of materials to be produced without an assembly interface, each object being obtained by the above technique.

In other words, it is possible to repeat at least once the step of high-resolution lithography and the step of dry deposition using a different inorganic material in order to produce an object formed of at least two different inorganic materials.

If the particular case of the process combining high-resolution photolithography (LIGA) and forming by triode sputtering (TS) is considered, the following features are obtained. Firstly, by virtue of this combination, the nature of the materials that can be deposited is enriched almost infinitely: from a chemical element to the most complex alloy, while the precision currently obtained only with chemical elements that can be deposited by electroplating is retained.

Depending on the method used (direct or indirect) for the photolithography step, the thicknesses obtained range from several atomic layers to a millimeter.

The same results and advantages as hereinbefore are obtained:
  precision of forming of the order of a micrometer in all directions with X-ray photolithography (slope error less than 1 µm/mm), which gives a precision of forming that has never been achieved, in the state of the art, with a superalloy. In the case of small thicknesses (coatings less than several micrometers), the use of UV photolithography enables a precision of forming of more or less 1 micrometer to be ensured in all directions, which also gives a precision of forming that has never been achieved, in the prior art, with a superalloy;
  the objects can be of large size (optionally by assembly of small objects) or of very small and/or very fine size (from several atomic layers to about 1 mm);

the materials which can be used can be all inorganic materials;

it is possible also to produce objects from a plurality of materials deposited in succession (multi-material components).

Another aspect of the invention relates to an object as obtained by carrying out the above process.

Such an object can, for example, be produced in the form of a spiral thrust bearing comprising an annular face on which there are formed spiral bosses delimited by spiral grooves having a depth of several micrometers.

Such an object can also, for example, be produced in the form of a lobe bearing of millimetric size.

The invention will now be described with reference to four exemplary embodiments and to the accompanying drawings, the examples and drawings being given solely by way of illustration.

EXAMPLE I

Fabrication of a Gas Thrust Bearing Having Spiral Grooves Made of Superalloy (Direct Process)

Figure 1:
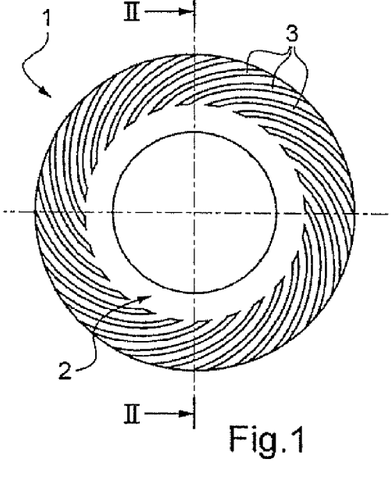
FIG. 1 is a front view of a thrust bearing provided with spiral grooves, which can be obtained by the process of the invention.
Figure 2:
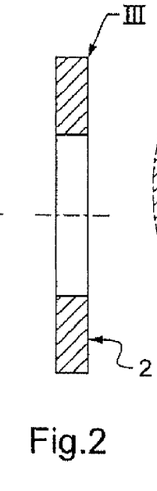
FIG. 2 is a sectional view according to line II-II of FIG. 1.
Figure 3:
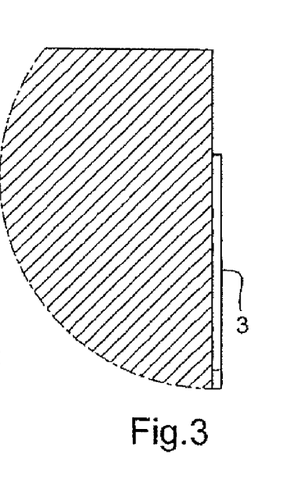
FIG. 3 shows detail III of FIG. 2 on an enlarged scale.

It is proposed to fabricate a gas thrust bearing with spiral grooves 1 for a microturbine, as shown in FIGS. 1 to 3. The thrust bearing 1 is an object of very small size which must be produced from nickel-based superalloy because it will be subjected to very high temperatures in an oxidizing atmosphere. It is an annular object, the outside diameter of which is of the order of about ten millimeters. One of the annular faces 2 is microstructured with bosses delimited by spiral grooves 3 of constant depth defined between several micrometers and several tens of micrometers (see the detail of FIG. 3). Such machining is impossible by conventional techniques (spark machining, milling, etc.).

Likewise, UV photolithography associated with electroplating cannot produce objects made of nickel-based superalloy.

According to the invention, in order to ensure a slope error of less than 1 µm/mm for the walls generated in direction Z, it has been chosen to construct this type of thrust bearing with spiral grooves by producing the negative of the bosses either by X-ray photolithography, for a constant height of the order of several micrometers, or by X-ray or UV photolithography for a smaller height, the photolithography step being followed by TS deposition of superalloy.

There is used here a process of photolithography on a suitable substrate. To that end, the substrate used is a superalloy called "IN 100" having the following composition:

| | Elements | | | | | | | | | | | |
|---|---|---|---|---|---|---|---|---|---|---|---|---|
| | Ni | Co | Cr | Al | Ti | Fe | Mo | V | Nb | C | Zr | B |
| wt. % | 59.2 | 13.2 | 10.3 | 5.2 | 4.2 | 3.3 | 3.0 | 0.9 | 0.6 | 0.17 | 0.05 | 0.01 |

The substrate was coated with photosensitive resin (for example SU-8) (negative resin), which is able to withstand temperatures of the order of 300° C. in vacuo. A photolithographic mask is placed on the resin and photolithography is carried out in order to produce a negative mold of photosensitive resin. This point was verified by thermogravimetric analysis (TGA). A target of IN 738LC superalloy, the function of which is to supply the material constituting the object to be fabricated, was machined and put in place. The composition of this alloy is as follows:

| | Elements | | | | | | | | | | |
|---|---|---|---|---|---|---|---|---|---|---|---|
| | Ni | Cr | Co | Mo | W | Ta | Nb | Al | Ti | C | B | Zr |
| wt. % | 61 | 16.0 | 8.5 | 1.7 | 2.6 | 1.7 | 0.9 | 3.4 | 4.5 | 0.1 | 0.02 | 0.1 |

The substrate was placed on a substrate holder cooled in such a manner that its temperature is always below 300° C. The chosen sputtering parameters are as follows: dissipated power less than 7.6 W/cm$^2$ (i.e. a polarization current of the target of 0.8 A) for a target-substrate distance of 40 mm. Under these conditions, a coating was obtained, the chemical composition of which is identical to that of the target. It is to be noted that dry depositions can be carried out parallel to the photolithography direction Z (as for this example and Example 4 hereinbelow) or perpendicular to the direction Z (as for Examples 2 and 3 hereinbelow) or at a different angle.

At this stage, the coating still does not have the characteristic microstructure of a superalloy. Therefore, the operations of elimination of the mask of SU-8 resin used in the lithography were combined with the homogenization treatment of the superalloy. To that end, the assembly of IN 100 substrate+1N738 LC spiral bosses+SU-8 resin was heated to a temperature of 1120° C. for two hours under argon and was then annealed at 845° C. for 24 hours in air. It goes without saying that the first treatment eliminated the organic resin completely and the second treatment removed any traces containing carbon from the surface.

A metallographic examination carried out at the end of these operations shows three important results:
1) The substrate/coating interface is almost invisible. It is as if the bosses had been machined in the bulk;
2) The coating has a typical microstructure of γ/γ' superalloy but with a finer distribution of the γ' phase than that found in the IN100 substrate;
3) The heat treatment has not deformed the coating.

Finally, the object so created was subjected to a high-temperature oxidation test, as is conventional for any object that is to be used under the severe environmental conditions (corrosive atmosphere, etc.) of a gas turbine. To that end, the spiral thrust bearing fabricated by photolithography followed by TS deposition was tested in isothermal oxidation at 1100° C. for 50 hours. No detachment of the spirals was observed. At the end of the test, a layer of oxides is found to have formed on the surface of the spirals. The subjacent microstructure has become monophase γ again, which is explained by the consumption of the aluminum from the γ' phase to form an $Al_2O_3$ protective oxide. However, it was noted that, relative to the bulk alloy constituting the substrate, the zone of aluminum depletion is small. This better resistance of the TS coating is probably due to the obtainment of an extremely fine microstructure, finer than that obtained with a bulk material.

By means of this technique, it is possible in future to create objects of superalloy having a precision that has never before been achieved: dimensions guaranteed to the micrometer, with a microstructure adapted to the use.

EXAMPLE II

Fabrication of a Gas Bearing of Superalloy
(Indirect Process)

Figure 4:
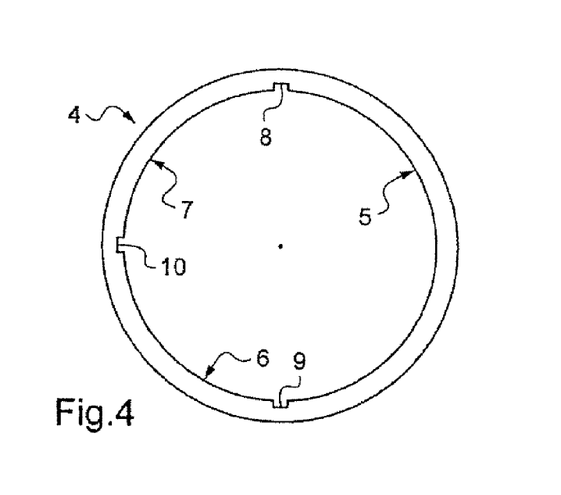
FIG. 4 is a front view of a lobe bearing which can be obtained by the process of the invention.

It is proposed to fabricate lobe bearings, which are constituted by off-center circular arcs, of high precision and great length. Such a gas bearing 4 is shown in a front view in FIG. 4. It is an object of annular cross-section delimited on the inside by three circular arcs 5, 6 and 7, the centers of which are offset. The circular arcs are separated by notches 8, 9 and 10 forming axial grooves. The bearing 4 has an outside diameter of the order of 5 to 6 mm and an axial length of 4 mm. In order to construct this object, four positive molds of polymer having a thickness of 1 mm are produced by deep X-ray photolithography. This technique makes it possible to ensure that the parallelism of the walls of a microstructure relative to the direction Z has a slope error of less than 1 micrometer per millimeter. The 4 positives are then stacked one on top of the other, alignment being ensured by locating elements. Then, using an anode centered on the tube, an electrolytic deposition of nickel is carried out inside the "lobed" tube, to which silver has previously been applied chemically in order to obtain an electrically conductive surface (as is known to the person skilled in the art), until a thickness sufficient to obtain a manipulable deposit (0.3 mm in the present case) is obtained. An electrically conductive substrate, for example an aluminum alloy such as AU4G (2017), known by the commercial name Duralumin or Dural, is used here.

The resin previously deposited on the substrate is then eliminated, which allows a negative mold of electrolytic nickel to be obtained. The negative mold is then placed in the center of a circular target of IN738 LC (superalloy) and the phase of deposition in the strict sense can begin. The thickness of the deposit is 0.5 mm. At the end of this operation and before removal, the outside of the deposit is ground so that it can fit with a slight clearance (standard ISO H7/g6) in another tube, which in this case is smooth. After this grinding operation, the nickel is dissolved in a nitric acid solution (50% by volume) supplemented with one gram of potassium chloride per liter. The superalloy cannot be chemically etched under these conditions.

At the end of these operations, the lobe bearing of superalloy is homogenized at 1120° C. for two hours under argon with a getter for oxygen, which treatment is followed by annealing at 845° C. for 24 hours, still under argon, with a getter for oxygen. The latter precaution is taken in order to avoid oxidation of the lobes. This two-step treatment is conventionally applied to superalloys during their production in order, in the first instance, to precipitate a finely dispersed γ' phase and, in the second instance, to stabilize that γ' phase. At the end of this treatment, a two-phase γ/γ' microstructure is obtained.

Once introduced into a receiving tube or sleeve, a lobe bearing of very high precision of IN738 LC superalloy having a fine microstructure is obtained. It was hitherto not possible to machine such a superalloy (IN738 LC) over such a length (4 mm) with such precision (less than a micrometer), whatever the machining method used.

EXAMPLE III

Fabrication of a Gas Bearing of Superalloy
(Indirect Process)

Figure 5:
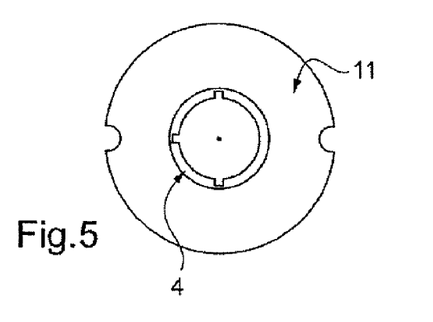
FIG. 5 is a front view of a lobe bearing analogous to that of FIG. 4 inserted into a receiving tube.

As in Example II, it is proposed to fabricate a lobe bearing of large size and great length of superalloy. The gas bearing 4 of FIG. 5 is analogous to that of FIG. 4, except that it is here inserted in a receiving tube 11 forming a sleeve.

Figure 6:
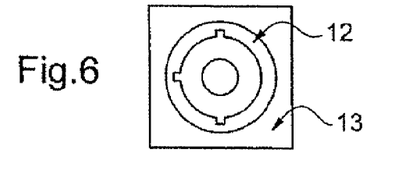
FIG. 6 is a top view of a resin mold formed on a substrate.

As compared with Example II, only the process of obtaining the complementary form of nickel changes. In this example, the complementary forms of the lobe bearings are produced by deep X-ray photolithography in a layer 12 of PMMA (polymethyl methacrylate) resin on an electrically conductive substrate 13 (FIG. 6). The substrate can be, as in Example II, an aluminum alloy such as the AU4G (2017) alloy, which is known by the commercial name Duralumin or Dural.

Figure 7:
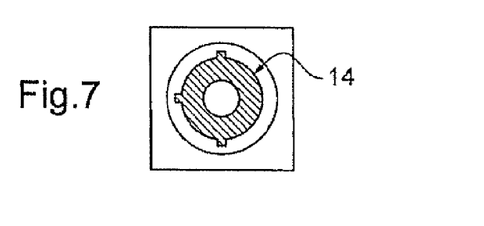
FIG. 7 is a view analogous to FIG. 6 after formation of a nickel object in the mold.

Subsequently, an imprint of the lobes is made by electroforming of nickel in the polymer mold to form a nickel object 14 of annular shape (FIG. 7).

Mechano-chemical polishing allows each of the nickel objects 14 to be brought to the correct thickness (for example 1 mm). Electrochemical deburring is carried out in order to remove the residual chips produced during polishing. The PMMA mold is then eliminated by dissolution in an organic solvent and detachment of the nickel objects 14 is carried out by chemical etching of the substrate. In the case of the AU4G (2017) alloy, etching is carried out in a basic sodium hydroxide solution (NaOH) at 10 g/l, this solution being harmless for the electroformed nickel.

Figure 8A:
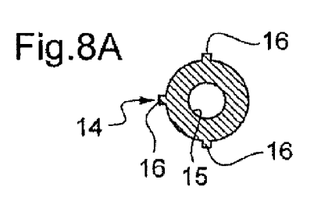
FIGS. 8A and 8B are a front view and a profile view, respectively, of the nickel object of FIG. 7, once it has been separated from the mold.
Figure 8B:
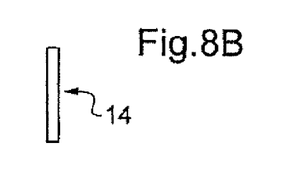

There are thus obtained nickel objects 14 analogous to those shown in FIGS. 8A and 8B. Each of the objects 14 is provided with a centering hole 15 with a locating element and comprises on the outside projecting lugs 16, the number of which corresponds to the number of lobes.

Figure 9A:
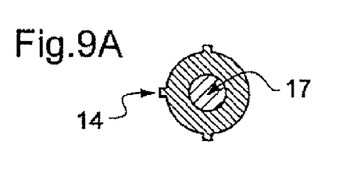
FIGS. 9A and 9B are a front view and a view in axial section, respectively, of an assembly formed by stacking four nickel objects on a mandrel.
Figure 9B:
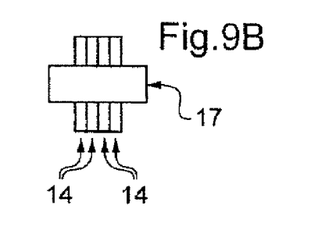

The objects 14 (of which there are four here) are stacked one on top of the other on a centering shaft 17, as shown in FIGS. 9A and 9B. Precise alignment of the nickel objects 14 is ensured by the locating elements.

Figure 10A:
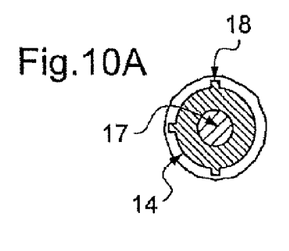
FIGS. 10A and 10B are views analogous to FIGS. 9A and 9B after TS deposition of a superalloy.
Figure 10B:
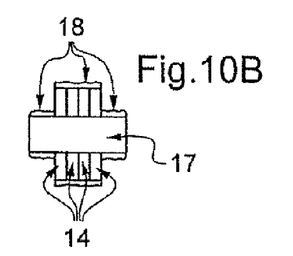

The assembly so formed is then placed in the center of a circular target of IN738 LC alloy, and the phase of TS deposition in the strict sense can begin. The thickness of the deposit 18 is 0.5 mm (FIGS. 10A and 10B).

Figure 11A:
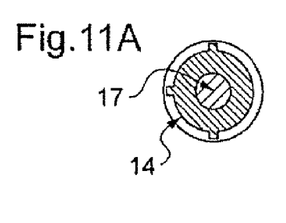
FIGS. 11A and 11B are views analogous to FIGS. 10A and 10B after grinding of the outside surface of the superalloy deposit.
Figure 11B:
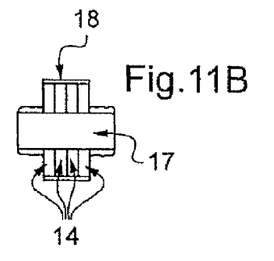
Figure 12A:
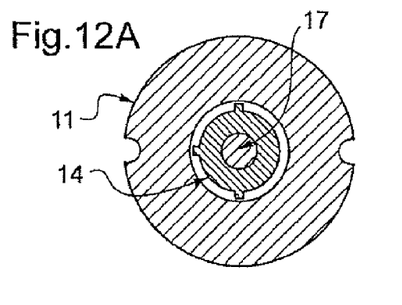
FIGS. 12A and 12B are views analogous to FIGS. 11A and 11B after the assembly has been fitted into a receiving tube.
Figure 12B:
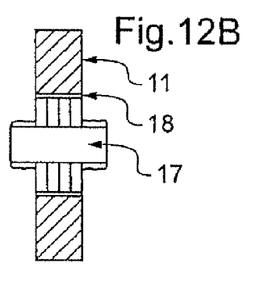
Figure 13A:
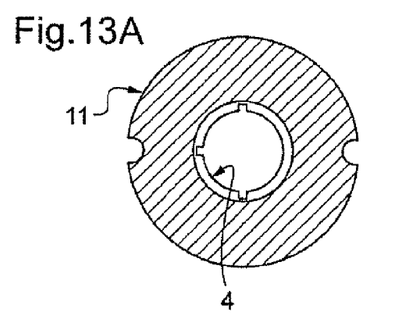
FIGS. 13A and 13B are views analogous to FIGS. 12A and 12B after dissolution of the nickel, which allows the lobe bearing fitted in the receiving tube to be obtained.
Figure 13B:
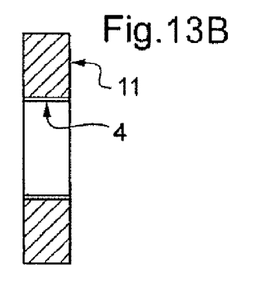

As in Example II, at the end of this operation and before removal, the outside of the deposit 18 is ground so as to obtain a smooth cylindrical surface (FIGS. 11A and 11B).

This allows the assembly so obtained to fit (normalized clearance H7/g6) in another smooth tube which constitutes the receiving tube 11 of FIG. 5.

After this grinding operation, the nickel is dissolved in a nitric acid solution (50% by volume) supplemented with one gram of potassium chloride per liter. The superalloy cannot be chemically etched under these conditions.

At the end of these operations, the superalloy lobe bearing is homogenized at 1120° C. for two hours under argon with a getter for oxygen, which treatment is followed by annealing at 845° C. for 24 hours, still under argon, with a getter for oxygen. The latter precaution is taken in order to avoid oxidation of the lobes. This two-step treatment is conventionally applied to superalloys during their production in order, in the first instance, to precipitate a finely dispersed $\gamma'$ phase and, in the second instance, to stabilize that $\gamma'$ phase. At the end of this treatment, a two-phase $\gamma/\gamma'$ structure is obtained.

Once introduced into the receiving tube 11, there is obtained a lobe bearing of very high precision of IN738 LC superalloy with a fine microstructure. It was hitherto impossible to machine such a superalloy (IN738 LC) over such a length (4 mm) with such precision (less than a micrometer), whatever the machining method used.

EXAMPLE IV

Fabrication of a High-Precision Object Starting from a Plurality of Materials

It is proposed to fabricate a demonstration object of millimetric size using a plurality of materials. The first alloy chosen is a shape-memory alloy, namely nitinol of stoichiometric composition NiTi. The second material is an alumina-type ceramic, and the third is another intermetallic, $\gamma$-TiAl. To that end, the substrate on which the sample is to be constructed is a ceramic sheet. Here too, the precision of the various parts must be of the order of a micrometer.

To that end, the following sequence is used:
depositing a photosensitive resin SU-8 on an alumina sheet. Revealing the desired form after illumination with a UV or X-ray source;
depositing NiTi on a cooled substrate (less than 300° C.) by TS;
positioning an electrolytic nickel mask obtained by X-ray photolithography;
depositing the ceramic by radiofrequency PVD (PVD-RF);
depositing a final layer of SU-8 (resin) on the NiTi+alumina assembly;
revealing the last form after illumination with a UV or X-ray source;
depositing the third alloy, $\gamma$-TiAl, by TS;
removing all the residues of SU-8 and dissolving the electrolytic nickel in a bath of $HNO_3$ at half, supplemented with 1 g/l of KCl.

At the end of these operations, a bimetallic object with a ceramic mandrel is obtained. In view of the nature of the deposited materials, it is impossible to obtain this by direct fabrication (electrolytic deposition, etc.). This example has been chosen to demonstrate the versatility of the process of the invention.

Accordingly, the invention is used preferably in the fabrication of high-precision micromechanical objects, in particular in the field of aeronautics, watch-/clock-making, etc.

The invention claimed is:

1. Process for fabricating a micromechanical object of millimetric size or larger, of high precision, formed of at least one inorganic material, characterized in that it comprises the following steps:
using a high-resolution photolithography process employing, in a chosen direction Z, radiation of a wavelength adapted to a desired degree of precision, to form a negative mold, which is not deformable on the micrometric scale during the steps of the process, in a resistant material that is resistant to a step of forming the object by dry deposition and that can either be removed without altering the fabricated object or separated from said object;
choosing, independently of the normal redox potential of its constituent elements, at least one inorganic material selected from the group of materials that cannot be deposited by electroplating but can be deposited by dry deposition and that satisfy the severe thermomechanical and environmental demands of a gas turbine; and
carrying out, by means of the non-deformable negative mold, by dry deposition of said at least one inorganic material, the forming of the micromechanical object that is of millimetric size or larger while having micrometric precision, comprising at least one part in the form of a straight cylinder whose generating line is parallel to the chosen direction Z, the slope error between said direction Z and walls of said part generated by dry deposition being less than 1 micrometer per millimeter of thickness.

2. Process according to claim 1, comprising a prior step in which there is chosen a substrate which will subsequently be used in the high-resolution photolithography process to produce the negative mold.

3. Process according to claim 2, wherein the negative mold is formed directly in the resistant material.

4. Process according to claim 2, wherein the resistant material is a photosensitive resin deposited on said substrate.

5. Process according to claim 2, wherein the resistant material is a metal deposited on said substrate.

6. Process according to claim 1, wherein the high-resolution photolithography process is a photolithography process that employs X-radiation.

7. Process according to claim 1, wherein the high-resolution photolithography process is a photolithography process that employs UV radiation.

8. Process according to claim 1, comprising the following subsequent steps:
removing the negative mold or separating it from the object to be fabricated; and
recovering the object so fabricated.

9. Process according to claim 1, wherein the step of the process relating to the high-resolution photolithography comprises the following sub-steps:
forming a positive mold of the object to be fabricated in a first material,
producing in or on the positive mold an electrolytic deposit of a second metallic material, which is the resistant material that is to constitute the negative mold, removing the first material in order to recover the negative mold constituted by the second material, and wherein the step of dry deposition is carried out in or on the negative mold of the second material.

10. Process according to claim 9, wherein the first material is a photosensitive resin.

11. Process according to claim 9, wherein the second material forming the negative mold is an electrolytic deposit.

12. Process according to claim 9, wherein the second material forming the negative mold is removed by chemical dissolution.

13. Process according to claim 1, wherein the dry deposition is chosen from:
   deposition by triode sputtering (TS),
   chemical vapor deposition (CVD) or plasma-enhanced CVD,
   deposition by spark plasma sintering (SPS),
   physical vapor deposition (PVD),
   physical deposition by evaporation, for example electron beam physical vapor deposition (EB-PVD).

14. Process according to claim 13, wherein the dry deposition is deposition by triode sputtering (TS).

15. Process according to claim 1, wherein the step of high-resolution lithography and the step of dry deposition are repeated at least once with a different inorganic material in order to produce an object formed of at least two different inorganic materials.

16. Process according to claim 1, wherein the inorganic material is chosen from: pure metals, multi-component alloys, superalloys, or any ceramic obtained by that process, and mixtures thereof.

17. Micromechanical object as obtained by carrying out the process according to claim 1, characterized in that the object is of millimetric size or larger while having micrometric precision, in that the object comprises at least one part in the form of a straight cylinder whose generating line is parallel to the direction Z, the slope error between said direction Z and the walls of the part being less than 1 micrometer per millimeter of thickness, and in that the object comprises the at least one inorganic material that cannot be deposited by electroplating but can be deposited by dry deposition and that satisfies the severe thermomechanical and environmental demands of a gas turbine.

18. Object according to claim 17, produced in the form of a spiral thrust bearing comprising an annular face on which there are formed bosses delimiting spiral grooves having a depth of several micrometers.

19. Object according to claim 17, produced in the form of a lobe bearing of millimetric size.

* * * * *